US008018684B2

(12) United States Patent
Ma et al.

(10) Patent No.: US 8,018,684 B2
(45) Date of Patent: Sep. 13, 2011

(54) METHOD FOR PREVENTING TMR MRR DROP OF A SLIDER AND METHOD FOR MANUFACTURING SLIDERS

(75) Inventors: HongTao Ma, Dongguan (CN); BaoHua Chen, Dongguan (CN); XiaoFeng Qiao, Dongguan (CN); Hongxin Fang, Dongguan (CN); WeiWei He, Dongguan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 886 days.

(21) Appl. No.: 12/007,252

(22) Filed: Jan. 8, 2008

(65) Prior Publication Data

US 2008/0212242 A1 Sep. 4, 2008

(30) Foreign Application Priority Data

Jan. 30, 2007 (CN) .......................... 2007 1 0006206

(51) Int. Cl.

| | |
|---|---|
| *G11B 5/60* | (2006.01) |
| *G11B 15/64* | (2006.01) |
| *G11B 17/32* | (2006.01) |

(52) U.S. Cl. ............... 360/235.3; 360/235.6; 360/235.7; 360/235.8; 360/237

(58) Field of Classification Search ........................ None
See application file for complete search history.

(56) References Cited

U.S. PATENT DOCUMENTS

| | | | | |
|---|---|---|---|---|
| 7,241,514 | B2 * | 7/2007 | Kagami et al. | 428/811.1 |
| 7,308,751 | B2 * | 12/2007 | Kagami et al. | 29/603.07 |
| 7,552,524 | B2 * | 6/2009 | Ma et al. | 29/603.16 |
| 2005/0068691 | A1 | 3/2005 | Kagami et al. | |

* cited by examiner

*Primary Examiner* — Duy-Vu N Deo
(74) *Attorney, Agent, or Firm* — Nixon & Vanderhye PC

(57) ABSTRACT

The invention provides a method for preventing TMR MRR drop of a slider, including: positioning a row bar constructed by sliders on a tray, each slider incorporating a TMR element; loading the tray into a processing chamber and evacuating the processing chamber to a predetermined pressure; forming a first etching means; exposing the sliders to the first etching means such that an oxide layer is formed on a surface of the TMR element; forming a second etching means; and exposing the sliders to the second etching means such that the oxide layer is etched to get a reduced thickness. The invention also discloses a method for manufacturing sliders.

13 Claims, 9 Drawing Sheets

METHOD FOR PREVENTING TMR MRR DROP OF A SLIDER AND METHOD FOR MANUFACTURING SLIDERS

This application claims priority to Chinese Application No. 200710006206.5 filed Jan. 30, 2007, the entire contents of which are hereby incorporated by reference.

FIELD OF THE INVENTION

The present invention relates to a method for manufacturing a slider, and more particularly, the invention relates to a method for preventing MRR (magneto-resistive resistance) drop of a TMR (tunnel magneto-resistive) type slider during a slider manufacturing process.

BACKGROUND OF THE INVENTION

One known type of information storage device is a disk drive device that uses magnetic media to store data and a movable read/write head that is positioned over the media to selectively read data from or write data to the media.

FIG. 1*a* illustrates a typical disk drive device 2. A magnetic disk 201 is mounted on a spindle motor 202 for spinning the disk 201. A voice coil motor arm 204 carries a head gimbal assembly (HGA) 200 that includes a slider 203 incorporating a read/write head and a suspension 213 to support the slider 203. A voice-coil motor (VCM) 209 is provided for controlling the motion of the motor arm 204 and, in turn, controlling the slider 203 to move from track to track across the surface of the disk 201. In operation, a lift force is generated by the aerodynamic interaction between the slider 203 and the spinning magnetic disk 201, such that the voice coil motor arm 204 maintains a predetermined flying height above the surface of the magnetic disk 201.

FIG. 1*b* shows a perspective view of the slider shown in FIG. 1*a*, and FIG. 1*c* shows a top plan view of the slider shown in FIG. 1*b*. As illustrated, the slider 203 comprises a leading edge 219 and a trailing edge 218 opposite to the leading edge 219. Four electrical connection pads 215 are provided on the trailing edge 218 for electrically connecting the slider 203 to the suspension 213 (as shown in FIG. 1*a*). The trailing edge 218 also has a pole tip 216 formed thereon which incorporates a magnetic read/write head (not shown) on its central position for achieving reading/writing operation with respect to the disk 201. The pole tip 216 is formed on the trailing edge 218 by suitable manner such as deposition. In addition, an air bearing surface pattern 217 is formed on one surface of the slider 213 perpendicular to both the leading edge 219 and the trailing edge 218.

As shown in FIG. 1*d*, the pole tip 216 has a layered structure and comprises from top to bottom a second inductive write head pole 116, a first inductive write head pole 118 spacing away from the second inductive write head pole 116, a second shielding layer 111 and a first shielding layer 113. All above components are carried on a ceramic substrate 122. The pole tip 216 is used for achieving data reading/writing operation. A magneto-resistive element (MR element) 112, along with a lead layer 114, which is disposed at two lateral sides of the MR element 112 and electrically connected to the MR element 112, is provided between the first shielding layer 113 and the second shielding layer 111. Referring to FIG. 1*e*, a set of copper coils 117 is provided between the second inductive write head pole 116 and the first inductive write head pole 118 for assisting in writing operation. In addition, an overcoat 115 consisting of a silicon layer 12 and a diamond-like carbon (DLC) layer 13 disposed on the silicon layer 12 is covered on the surface of the pole tip and surface of the ceramic substrate 122 to protect the slider.

In structure of above slider, a GMR (giant magneto-resistive) element is normally used as a read element to achieve data reading operation. However, with continuously increasing demand of a hard disk drive (HDD) of a higher recording density, current application of GMR element has almost gotten to its extreme limit. As a result, a new MR element such as a tunnel magneto-resistive (TMR) element, which can achieve higher recording density than a GMR element, is developed to replace the GMR element.

Referring to FIG. 1*f*, a conventional TMR element 10 comprises two metal layers 11 and a barrier layer 14 sandwiched between the two metal layers 11. The overcoat 115 consisting of a silicon layer 12 and a DLC layer 13 disposed on the silicon layer 12 is covered on the surface of the metal layers 11 and the barrier layer 14 to protect the TMR element 10.

In manufacturing process of a slider, the magneto-resistive resistance (MRR) value of a TMR element must be controlled to be higher than a predetermined value so as to maintain good flying dynamic performance for the slider. For example, in lapping process of a slider, the TMR element should be precisely lapped in order to adjust the MR height thereof to a designed value, since the MR height has great influence on the MRR value, thus further influencing the dynamic performance of the slider. Take another example, in vacuum process of the slider, the MR height should be kept constant all the time so that the MRR is unchanged.

However, in conventional TMR element structure, since metal layers are in direct contact with the silicon layer of the overcoat, the metal material of the metal layers readily diffuses into the silicon layer, and the metal material diffused into the silicon layer itself forms electrically conductive lead, which electrically connects the two metal layers together, thus a shunting path for circuitry of the TMR element being formed. The shunting path results in reduction of the MRR value of the TMR element, and consequently, degrades dynamic performance of the slider and read/write performance of the HDD. It is proved by experiment that after an overcoat is covered on the surface of the TMR element in a vacuum process, the MRR drop is about 4%, and sometimes the MRR drop can even dramatically rise to 10%, which is fatal to dynamic performance of the slider.

Therefore, there is a need for an improved design to overcome the prior art drawbacks.

SUMMARY OF THE INVENTION

One aspect of the present invention is to provide a method for preventing TMR MRR drop of a slider, which can effectively prevent MRR drop of a TMR element of a slider, thus improving dynamic performance and data read/write performance of the slider.

Another aspect of the present invention is to provide a method for manufacturing a slider, which can prevent TMR MRR drop of a slider, thus improving dynamic performance and data read/write performance of the slider.

To achieve above objects, the method for preventing TMR MRR drop of a slider provided by present invention includes steps of: (a) positioning a row bar constructed by a plurality of sliders on a tray, each slider incorporating a TMR element; (b) loading the tray into a processing chamber and evacuating the processing chamber to a predetermined pressure; (c) introducing a processing gas containing oxygen gas into the processing chamber, and ionizing the processing gas, thus forming a first etching means; (d) exposing the sliders to the first etching means such that an oxide layer is formed on a surface of the TMR element; (e) evacuating the processing chamber, introducing argon gas into the processing chamber, and then ionizing the argon gas, thus forming a second etching means; and (f) exposing the sliders to the second etching means such that the oxide layer is etched to get a reduced thickness.

In step (f), the oxide layer is etched to have a thickness ranging from 1 nm to 4 nm, and preferably is 1.5 nm. It is proved by experiment that the oxide layer of such a thickness can effectively prevent metal material diffusion, thus improving dynamic performance of the slider and read/write performance of the disk drive device. In addition, the oxide layer of such a thickness has little influence on reading/writing signal transmittal of the slider, thus having little influence on data read/write performance of the slider. Hence, good data read/write performance is maintained for the slider.

In an embodiment of the present invention, the processing gas used in the step (c) is oxygen gas; and in another embodiment of the present invention, the processing gas used in the step (c) is a mixture of oxygen gas and noble gas.

In addition, the first and second etching means can be plasma or ion beam. The plasma can be generated by direct capacitance coupling, inductively coupling or Electron Cyclotron Resonance (ECR).

The method for manufacturing a slider provided by the present invention comprises the step of: (1) positioning a row bar constructed by a plurality of sliders on a tray, each slider incorporating a TMR element; (2) loading the tray into a processing chamber, and evacuating the processing chamber to a predetermined pressure; (3) introducing a processing gas containing oxygen gas into the processing chamber, and ionizing the processing gas, thus forming a first etching means; (4) exposing the sliders to the first etching means such that an oxide layer is formed on a surface of the TMR element; (5) evacuating the processing chamber, introducing argon gas into the processing chamber, and then ionizing the argon gas, thus forming a second etching means; (6) exposing the sliders to the second etching means such that the oxide layer is etched to get a reduced thickness; (7) forming a silicon layer on the surface of the TMR element of the slider; (8) forming a diamond-like carbon layer on the silicon layer; (9) cutting the row bar into individual sliders.

Compared to conventional technology, the oxide layer thus formed according to the present invention has the function of a barrier layer which electrically isolates the metal layers away from the silicon layer of the TMR element, thus preventing diffusion of the metal material of the metal layers into the silicon layer. Therefore, a shunting path between the TMR element and the silicon layer is barred from being constructed, and accordingly, the MRR value of the TMR element is kept constant all the time during the manufacturing process of the slider, hence, the dynamic performance and read/write performance of the slider being improved greatly.

For the purpose of making the invention easier to understand, several particular embodiments thereof will now be described with reference to the appended drawings in which:

DETAILED DESCRIPTION OF ILLUSTRATED EMBODIMENTS

Various embodiments of the present invention will now be described with reference to the figures. The invention provides a method for preventing MRR (magneto-resistive resistance) drop of a TMR (tunnel magneto-resistive) element of a slider, which includes steps of: (a) positioning a row bar constructed by a plurality of sliders on a tray, each slider incorporating a TMR element; (b) loading the tray into a processing chamber and evacuating the processing chamber to a predetermined pressure; (c) introducing a processing gas containing oxygen gas into the processing chamber, and ionizing the processing gas, thus forming a first etching means; (d) exposing the sliders to the first etching means such that an oxide layer is formed on a surface of the TMR element; (e) evacuating the processing chamber, introducing argon gas into the processing chamber, and then ionizing the argon gas, thus forming a second etching means; and (f) exposing the sliders to the second etching means such that the oxide layer is etched to get a reduced thickness. The oxide layer electrically separates the metal layers of the TMR element and the silicon layer of the overcoat, and consequently, diffusion of the metal material of the metal layers into the silicon layer is barred, thus avoiding formation of a shunting path between the TMR element and the silicon layer. Therefore, the MRR value of the TMR element is kept unchanged during the whole manufacturing process of a slider, and the dynamic performance of the slider and read/write performance of the disk drive device are improved greatly. In addition, the thickness of the oxide layer thus formed can be reduced by the step (f), and consequently, damping influence of the oxide layer on read/write signal of the slider is effectively reduced, thus enhancing the data read/write performance of the slider.

Figure 1A:
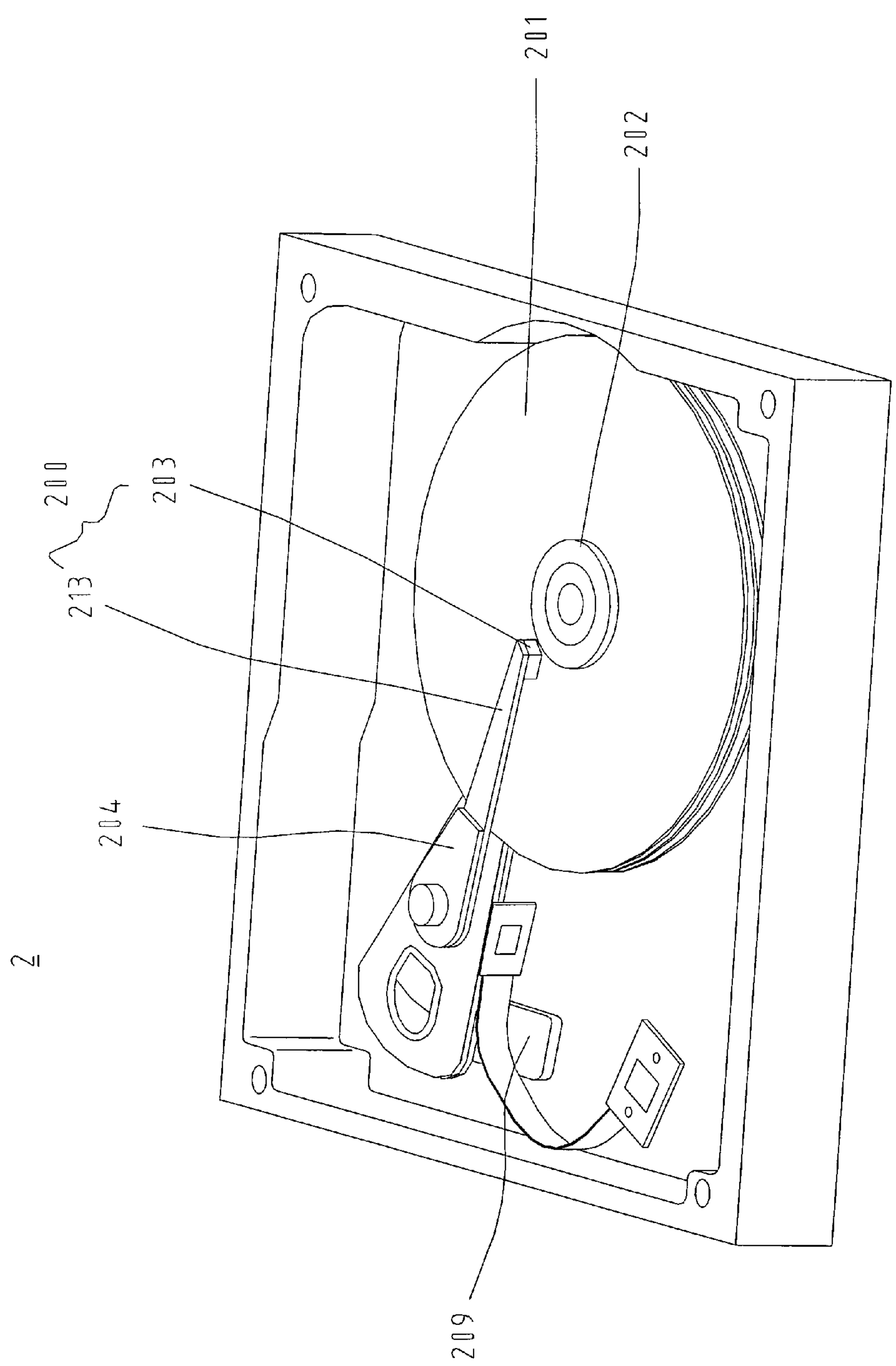
FIG. 1*a* is a perspective view of a conventional disk drive device.
Figure 1B:
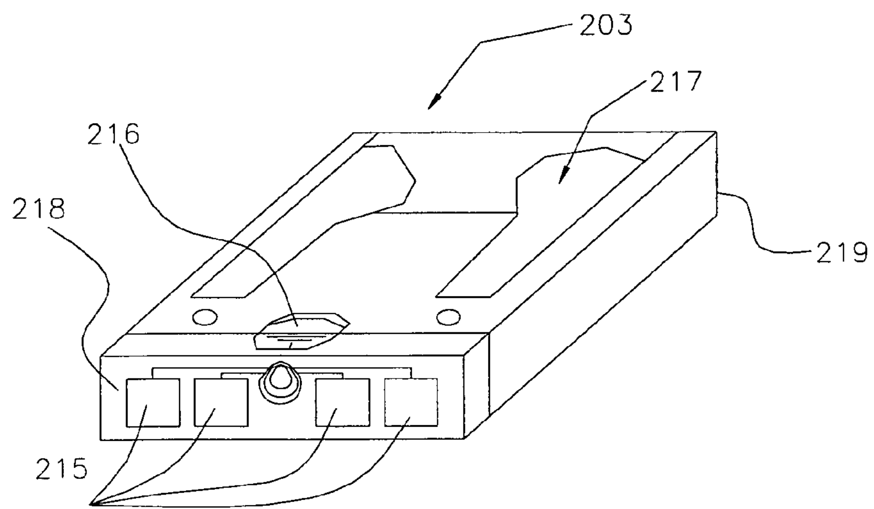
FIG. 1*b* is a perspective view of a slider shown in FIG. 1*a;*
Figure 1C:
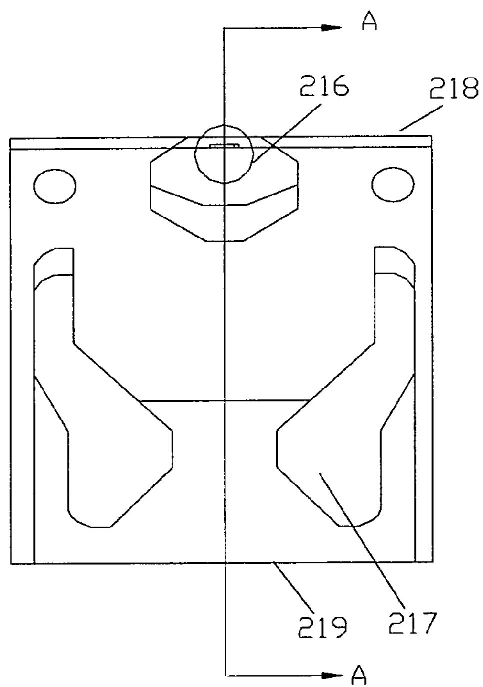
FIG. 1*c* is a top plan view of the slider shown in FIG. 1*b;*
Figure 1D:
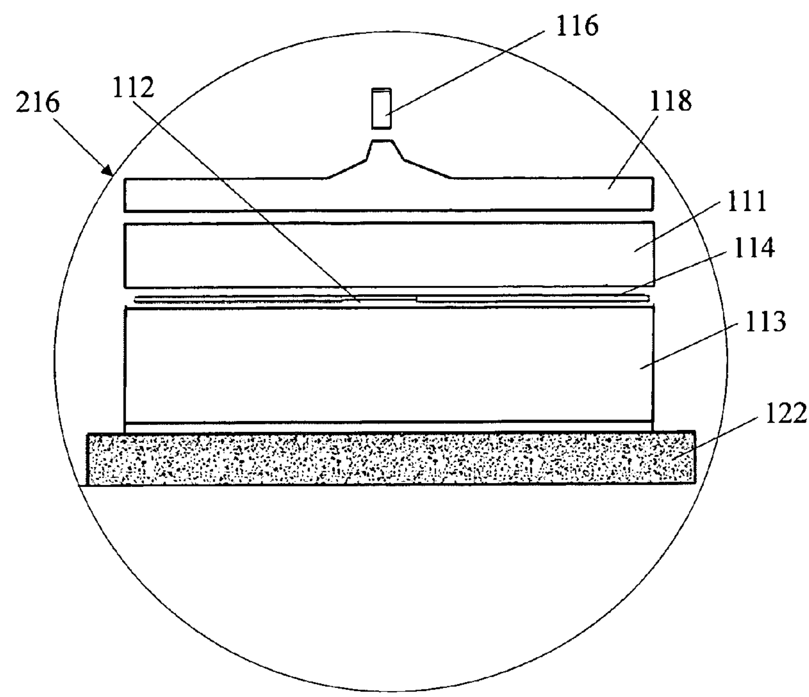
FIG. 1*d* is a partially enlarged view of the slider of FIG. 1*c;*
Figure 1E:
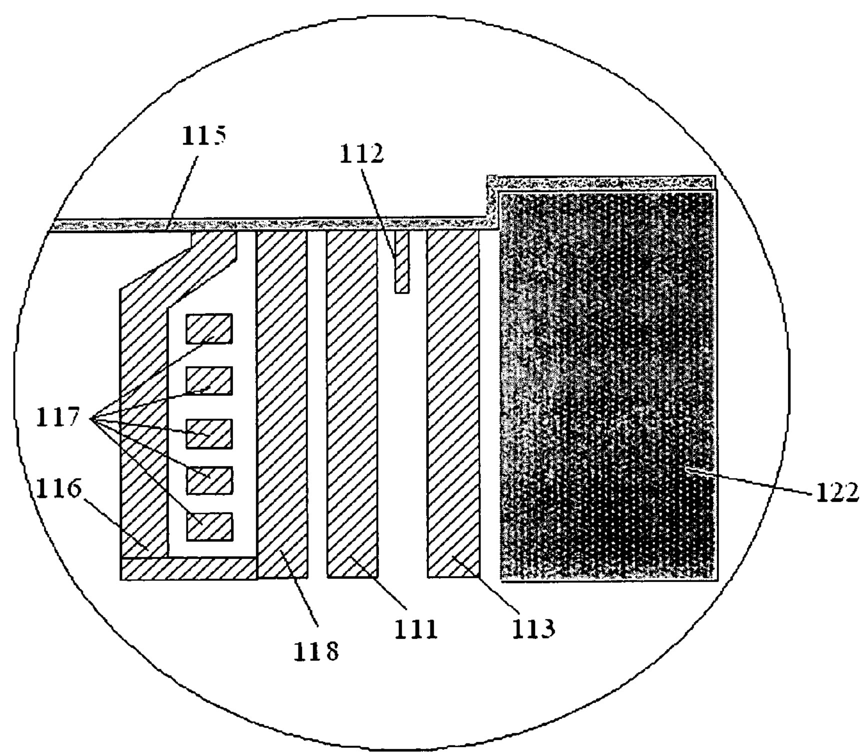
FIG. 1*e* is a partially enlarged, cross-sectional view of the structure shown in FIG. 1*c* taken along line A-A.
Figure 1F:
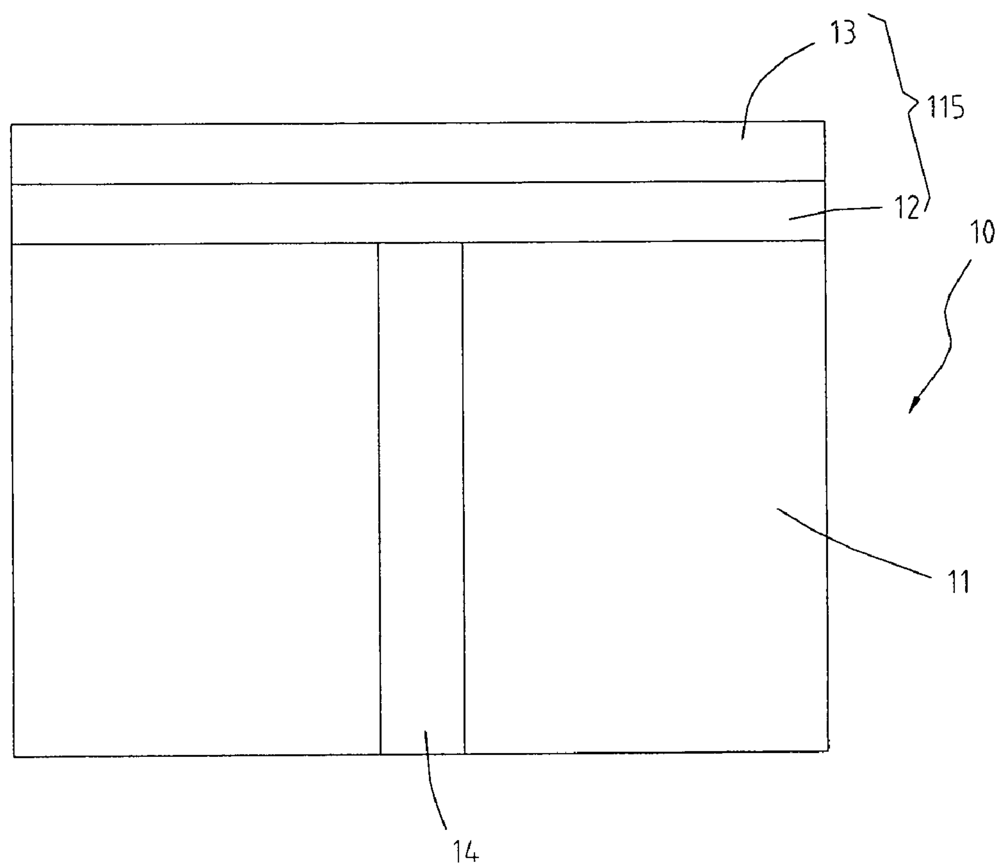
FIG. 1*f* shows a structure of a conventional TMR element.
Figure 2A:
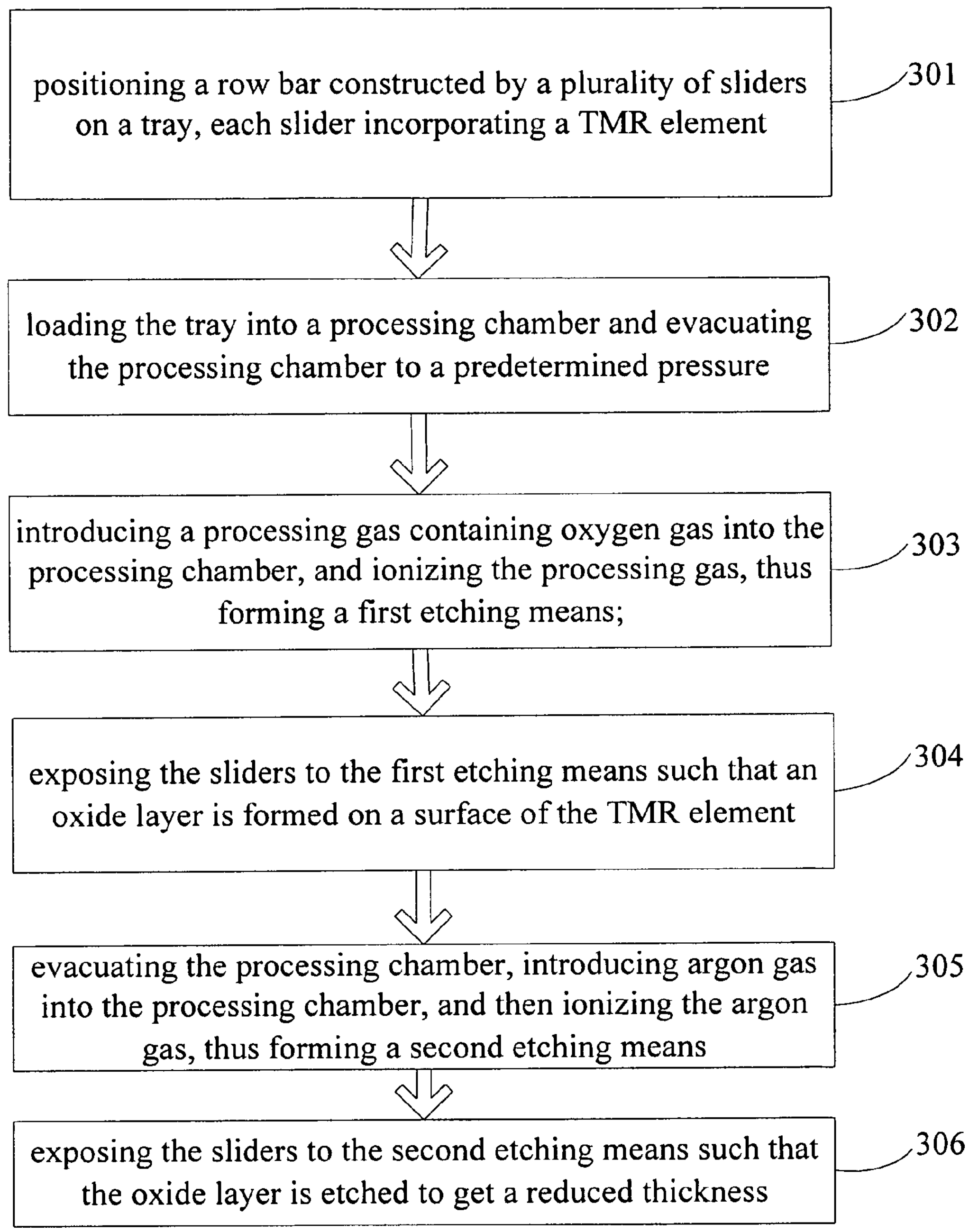
FIG. 2*a* shows a flowchart illustrating a method for preventing TMR MRR drop of a slider according to an embodiment of the invention.

FIG. 2*a* shows a method for preventing TMR MRR drop of a slider according to an embodiment of the invention. As shown in the figure, the method includes the steps of: firstly, positioning a row bar constructed by a plurality of sliders on a tray, each slider incorporating a TMR element (step 301); next, loading the tray into a processing chamber and evacuating the processing chamber to a predetermined pressure (step 302); introducing a processing gas containing oxygen gas into the processing chamber, and ionizing the processing gas, thus forming a first etching means (step 303); then, exposing the sliders to the first etching means such that an oxide layer is formed on a surface of the TMR element (step 304); after that, evacuating the processing chamber, introducing argon gas into the processing chamber, and then ionizing the argon gas, thus forming a second etching means (step 305); at last, exposing the sliders to the second etching means such that the oxide layer is etched to get a reduced thickness (step 306).

Figure 2B:
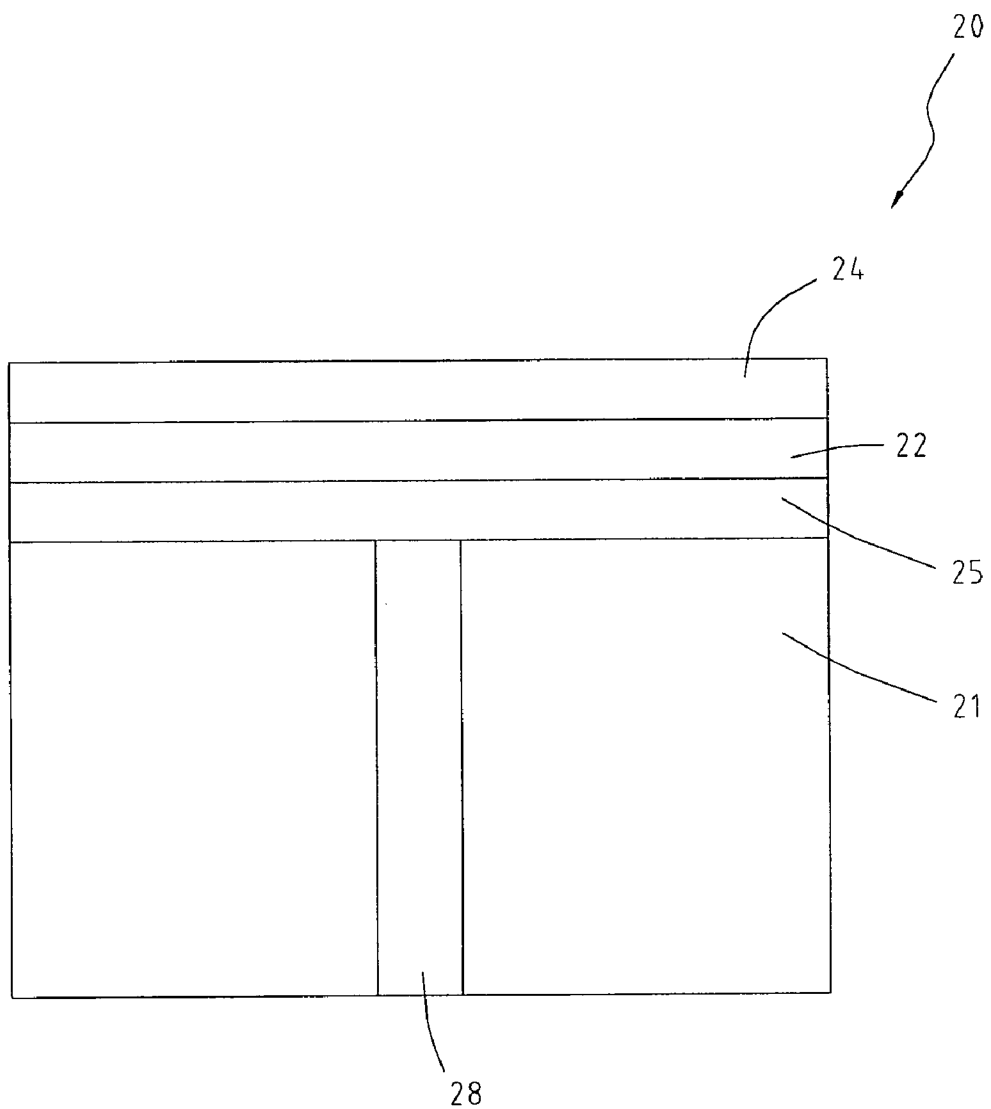
FIG. 2*b* shows a TMR element of a slider with an oxide layer formed on a surface of the TMR element according to the invention.

FIG. 2*b* schematically shows the structure of a TMR element 20 with an oxide layer formed thereon according to the method of the present invention. As shown in the figure, the TMR element 20 comprises two metal layers 21, a barrier layer 28 sandwiched between the two metal layers 21, an oxide layer 25 covered on a surface of the TMR element 20, a silicon layer 22 covered on the oxide layer 25 and, a diamond-like carbon (DLC) layer 24 covered on the silicon layer 22. More concretely, the oxide layer 25 covers on all of the two metal layers 21 and the barrier layer 28. The combination of the silicon layer 22 and the DLC layer 24 is also referred to as an overcoat.

The purpose of etching the oxide layer via the second etching means in the step 306 is to reduce the thickness of the oxide layer. Because it is difficult to accurately control the process of forming the oxide layer in the step 304, the thickness of the oxide layer thus formed cannot achieve the desirable value. In normal case, the thickness of the oxide layer formed in the step is much greater than the desirable value. In case that the flying height of a slider keeps constant, a thicker oxide layer will result in a longer distance between the read/write element of the slider and the magnetic disk. Thus, the read/write signal of the slider with respect to tracks will become weak, and correspondingly, the read/write performance of the slier will become poor. Therefore, it is necessary to reduce the thickness of the oxide layer in order to avoid or reduce negative influence on the performance of the slider caused by the oxide layer.

The thickness of the finally formed oxide layer 25 according to the present method ranges from 1.5 nm to 4 nm, and preferably is 1.5 nm. It is proved by experiment that the oxide layer of such a thickness can effectively prevent the diffusion of the metal material, thus improving the dynamic performance of the slider and the read/write performance of the disk drive device. In addition, the oxide layer of such a thickness has little bad influence on the transmittal of read/write signal of the slider, thus having little influence on the data reading/writing performance of the slider. Consequently good data read/write performance for the slider is maintained.

In the above embodiment, the processing gas in the step 303 can be oxygen gas or a mixture of oxygen gas and inert gas such as Argon, Neon, Xenon, or Helium gas. In addition, the first and second etching means can comprise plasma or ion beam. The plasma can be generated by any suitable method such as direct capacitance coupling, inductively coupling or ECR (Electron Cyclotron Resonance, ECR).

In the step 304, the first etching means oxidizes a surface of the metal layers 21 to form an oxide layer 25 thereon. When the overcoat (the combination of the silicon layer 22 and the DLC layer 24) is covered on the surface of the TMR element 20, there is no direct contact between the silicon layer 22 of the overcoat and the metal layers 21, and therefore, diffusion of metal material of the metal layers 21 into the silicon layer 22 is barred, thus formation of a shunting path of the circuitry of the TMR element being obstructed. Accordingly, MRR value drop of the TMR element is avoided or reduced, hence, dynamic performance of the slider and read/write performance of the HDD being maintained as well. This advantage will be illustrated below in conjunction with FIGS. 3*a*-3*b*.

Figure 3A:
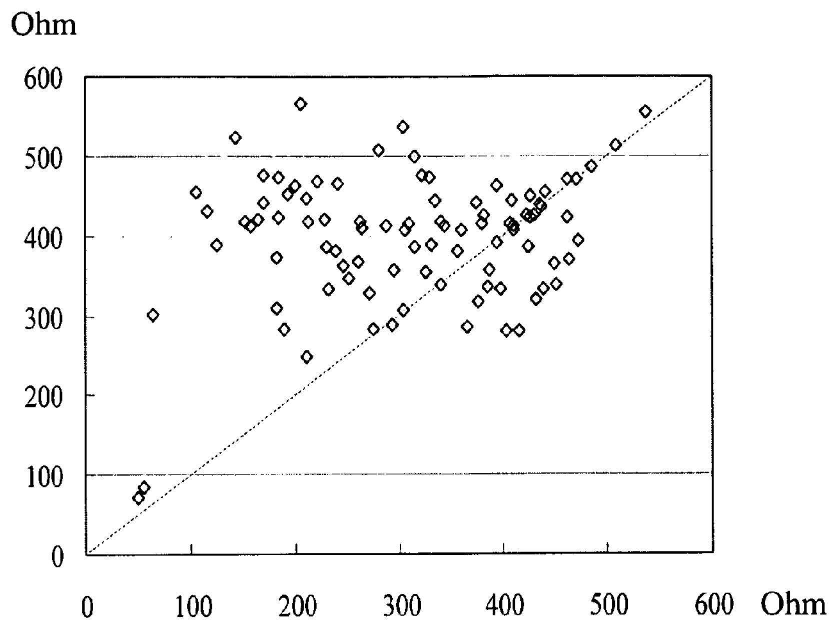
FIG. 3*a* shows TMR MRR changes before and after forming an overcoat on TMR elements of a plurality of sliders according to conventional method.
Figure 3B:
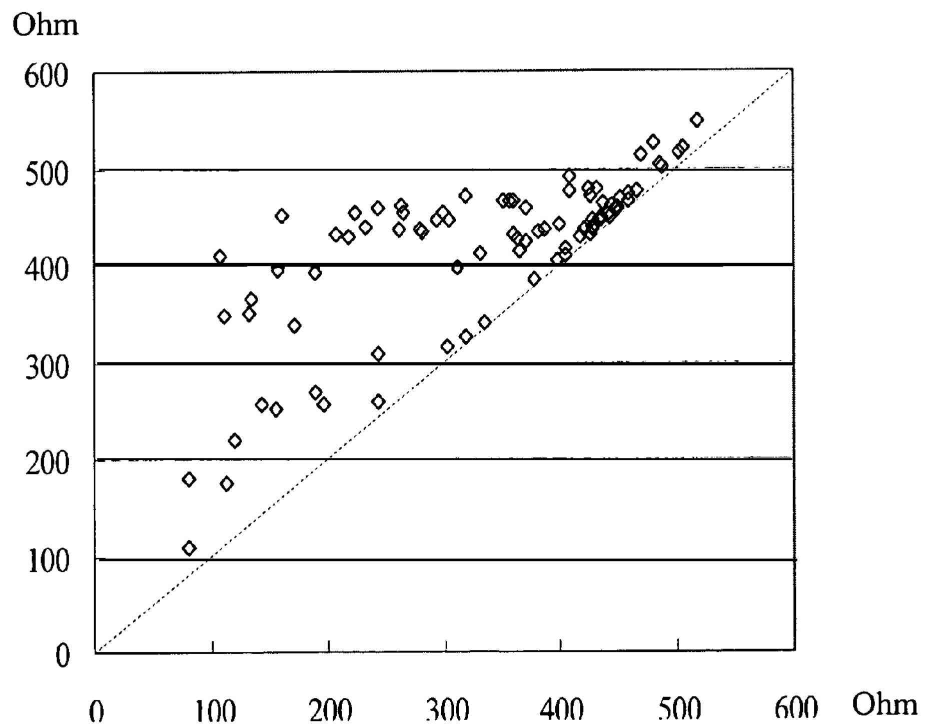
FIG. 3*b* shows TMR MRR changes before and after forming an overcoat on TMR elements of a plurality of sliders according to a method of the present invention.

FIG. 3*a* shows TMR MRR changes before and after forming an overcoat on TMR elements of a plurality of sliders according to a conventional technology; and FIG. 3*b* shows TMR MRR changes before and after forming an overcoat on TMR elements of a plurality of sliders according to the method of the present invention. In the figures, abscissa shows resistance value (unit: Ohm) of a corresponding TMR element before the overcoat is formed there on the TMR element, ordinate shows a corresponding resistance value (unit: Ohm) after the overcoat is formed thereon, and the diagonal (slope equals 1) serves as a threshold line for determining increase or decrease of the resistance value. The dots on the diagonal mean that the resistance value after the overcoat is formed is the same as that before the overcoat is formed. The dots above the diagonal mean that after the overcoat is formed, the resistance value is bigger than that before the overcoat is formed. The dots below the diagonal mean that after the overcoat is formed, the resistance value is smaller than that before the overcoat is formed. As shown in FIG. 3*a*, some testing dots lie below the diagonal meaning that the value of MRR of TMR elements of some sliders of the plurality of tested conventional sliders drops after the overcoat is formed, that is, the resistance is reduced. This reduction in resistance results in poor data read/write performance of a slider. In contrast, as shown in FIG. 3*b*, there is almost no test dot below the corresponding diagonal showing that there is no obvious drop of resistance value of TMR elements of a plurality of tested sliders after the overcoat is formed, because the overcoat and the TMR element are isolated from each other by application of the method of the invention, and therefore, there is no problem of diffusion of the metal material of the TMR element into the silicon layer.

As a method for forming an overcoat on the surface of a TMR element of a slider, chemical vapor deposition (CVD), ion beam deposition (IBD), or filtered cathodic arc (FCA) are commonly employed in the related art. Generally, three steps, i.e., pre-cleaning, silicon layer coating, and DLC coating are involved in the formation of an overcoat.

More particularly, the pre-processed sliders are normally cleaned in atmosphere and then are loaded into a vacuum chamber which is vacuumed. The surface to be processed of the sliders (generally a surface which will be processed to be an air bearing surface) normally absorbs moisture, carbon dioxide, and even organic solvent used to clean the sliders. In the step of pre-cleaning, plasma etching or ion beam etching using oxygen gas or a mixture of oxygen gas and noble gas, such as argon, is employed to remove the contamination from the surface to be processed. After the etching process, a very small amount of material is removed from the surface of the slider and no significant change of the surface roughness occurs. In other words, the surface roughness (Ra) of the slider still remains about 0.3 nm.

Once the pre-cleaning is done, an adhesion layer is coated on the processed surface of the slider. Preferably, the adhesion layer is made of silicon, which makes the DLC layer grow on the surface of the slider easily. In addition, during the DLC layer coating step, methane or ethylene is used as a precursor for CVD and IBD process, while pure graphite cylinder is used as a FCA target.

The method for preventing TMR MRR drop of a slider according to the present invention is performed in the pre-cleaning process, and this method can be done by a variety of devices. The devices and processes thereof will be described hereinafter.

Figure 4A:
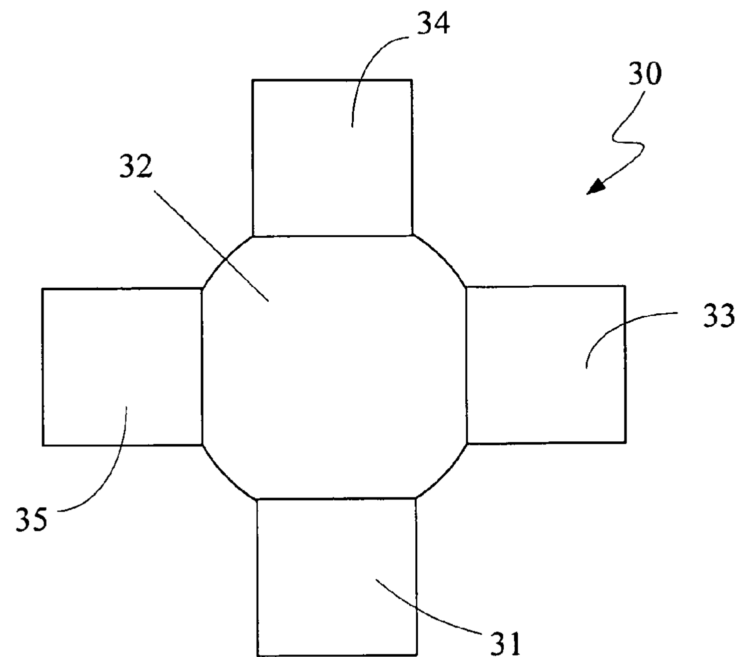
FIG. 4*a* schematically shows a block diagram illustrating a device used in the present method according to an embodiment of the invention.

FIG. 4*a* schematically shows the structure of a device used to perform the present method. Sliders arranged in arrays (also called row bars), are fixed on a tray. The tray is loaded into a vacuum transfer chamber 32 of a device 30 through a loading/unloading port 31. Next, the transfer chamber 32 is pumped down to a preset pressure. Then, is transferred into a plasma etching chamber 33.

Next, a plasma etching process begins. The plasma etching chamber 33, in which the tray is contained, is pumped down to a preset pressure. A processing gas such as oxygen gas or mixture of oxygen gas and noble gas is introduced into the plasma etching chamber 33 via a mass flow controller (MFC) valve (not shown). After introduction, the processing gas is ionized (i.e., the process of generating plasma). There are various ways to generate plasma such as directly capacitance coupling or inductive coupling via a radio frequency power. Of course, some newly developed methods such as ECR can also be used to generate plasma. Then, the plasma generated in the plasma etching chamber 33 etches the surface of each slider for the first time to remove the contamination from the slider surface and to form an oxide layer on the surface of the slider (i.e., the surface of the TMR element of the slider, and more particularly, the metal layers of the TMR element).

The plasma is set off after elapse of a preset time period. Next, the plasma etching chamber 33 is evacuated again and argon gas is introduced into the plasma etching chamber 33 via a MFC valve. After that, suitable method such as aforementioned directly capacitance coupling or inductive coupling via a radio frequency power or ECR is employed such that plasma is generated. The plasma etches the oxide layer for a second time to properly reduce the thickness of the oxide layer. The plasma is set off again after elapse of a preset etching time period. The etching time is determined based on a desired etching volume of the oxide layer thickness of the TMR element of the slider.

Next, the tray is moved to a silicon coating chamber 34, in which silicon material is sputter-coated on the surface of the slider (concretely coated on the oxide layer thereof). The tray is then transferred to a coating chamber 35, in which the surface of the slider is coated with a-C:H (DLC with hydrogen) or ta-C (tetrahedral DLC without hydrogen). In the chamber, a layer of DLC is deposited on the surface of the slider, thus an overcoat having a silicon layer and a DLC layer is formed on the surface of the slider (the surface of TMR element of the slider) in order to avoid or reduce erosion of the slider by outside environment.

Critical factors that affect the quality of plasma etching process include type of processing gas, pressure of processing chamber, etching power and etching time. The gas used for the first time etching in the plasma etching process of the present invention can be oxygen gas or a mixture of oxygen and noble gas according to the ratio of $Al_2O_3$ to TiC (both of which are main materials for constructing ceramic substrate of a slider). The processing gas used for the second time etching is pure argon gas. The flow rate of the processing gas used for the two time etching is controlled by a MFC to achieve a desired pressure.

The power supply for the method of the present invention can be adjusted in accordance with the device, and the power supply is used for generating plasma and providing a bias for the slider during the whole plasma etching process. In an embodiment of the present invention, a self bias of 300V DC is applied to the slider. The purpose of forming the bias is to provide kinetic energy for the plasma such that physical etching can be performed.

Figure 4B:
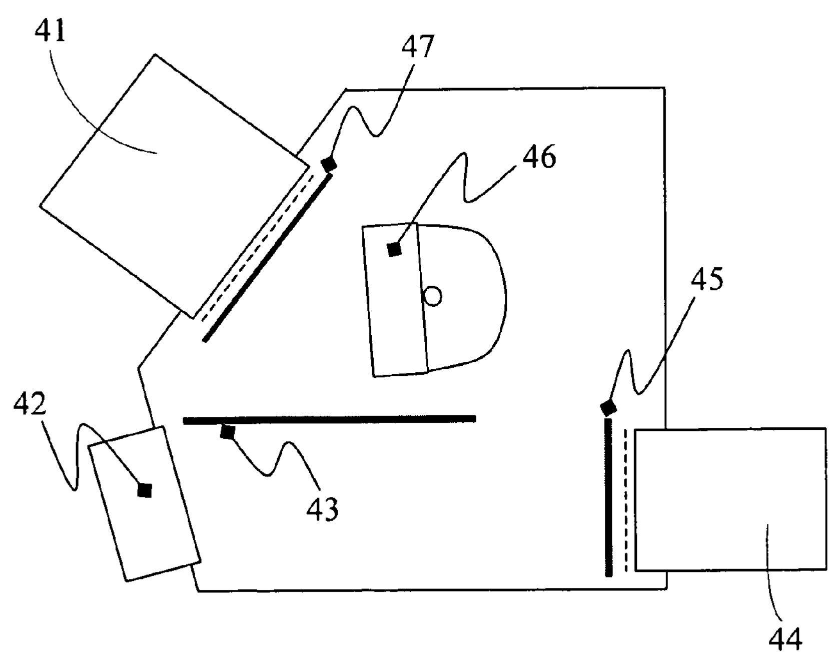
FIG. 4*b* schematically shows a block diagram illustrating a device used in the present method according to another embodiment of the invention.

In another embodiment of the invention, the plasma etching is replaced by ion beam etching. The device for carrying out the ion beam etching procedure is shown in FIG. 4*b*. The ion beam etching procedure runs as follows: firstly, loading a tray that carries a plurality of sliders into a vacuum processing chamber (not labeled) and fixing the tray with a product holder 46. The product holder 46 is operable to tilt between 0-90 degrees. Then, the vacuum processing chamber is pumped down to a preset pressure.

After that, processing gas, such as oxygen gas or a mixture of oxygen gas and noble gas, is introduced into a first ion source 41. The first ion source 41 is separated from the product holder 46 by a first shutter 47. Then, the process gas is ionized to become ions of high energy.

Once the ions are stabilized, the product holder 46 is tilted to a preset angle (facing the first shutter 47), and the first shutter 47 is opened to allow the ions to bombard the sliders fixed on the tray for carrying out a first time pre-cleaning (etching) operation for the sliders and forming an oxide layer on the surface of the sliders (the surface of the TMR element of each slider). Throughout the entire etching process, internal pressure inside the processing chamber maintains at about 0.03-0.05 Pa.

After a period of time elapses, the first shutter 47 is closed and the first ion source 41 is also shut down. The vacuum processing chamber is evacuated (that is, the processing gas and the gases generated during the etching procedure are removed), and then, the gas contained in the first ion source 41 is replaced by argon gas. Then, the argon gas is ionized to become ions of high energy. Next, the first shutter 47 is opened again to allow the ions to pre-clean (etch) the sliders for a second time, and the result of the pre-cleaning is the reduction in thickness of the oxide layer.

After a period of time elapses, the first shutter 47 is closed again, and the power of the first ion source 41 is also closed. The processing chamber is again pumped down to a preset pressure. The tray is tilted to another preset direction. Then, bombarding gas such as argon gas contained in a second ion source 44 is ionized to become argon ions. A third shutter 43 and a second shutter 45 are then opened, and the argon ions of high energy bombard a silicon target 42 such that partial silicon atoms escape from the silicon target 42 and are sputtered on the surface of the slider, thus forming a silicon layer on the surface of the slider.

Next, the third shutter 43 and the second shutter 45 are closed again. The tray is again tilted to a position facing the first ion source 41. But at this time, the processing gas contained in the first ion source 41 is changed to $C_2H_4$ for forming a C:H coating. Similarly, in the process, the processing gas is ionized and deposited to the surface of the slider. The processing time of this period is determined by the desired thickness of the C:H coating and the deposition rate of the layer.

Figure 5:
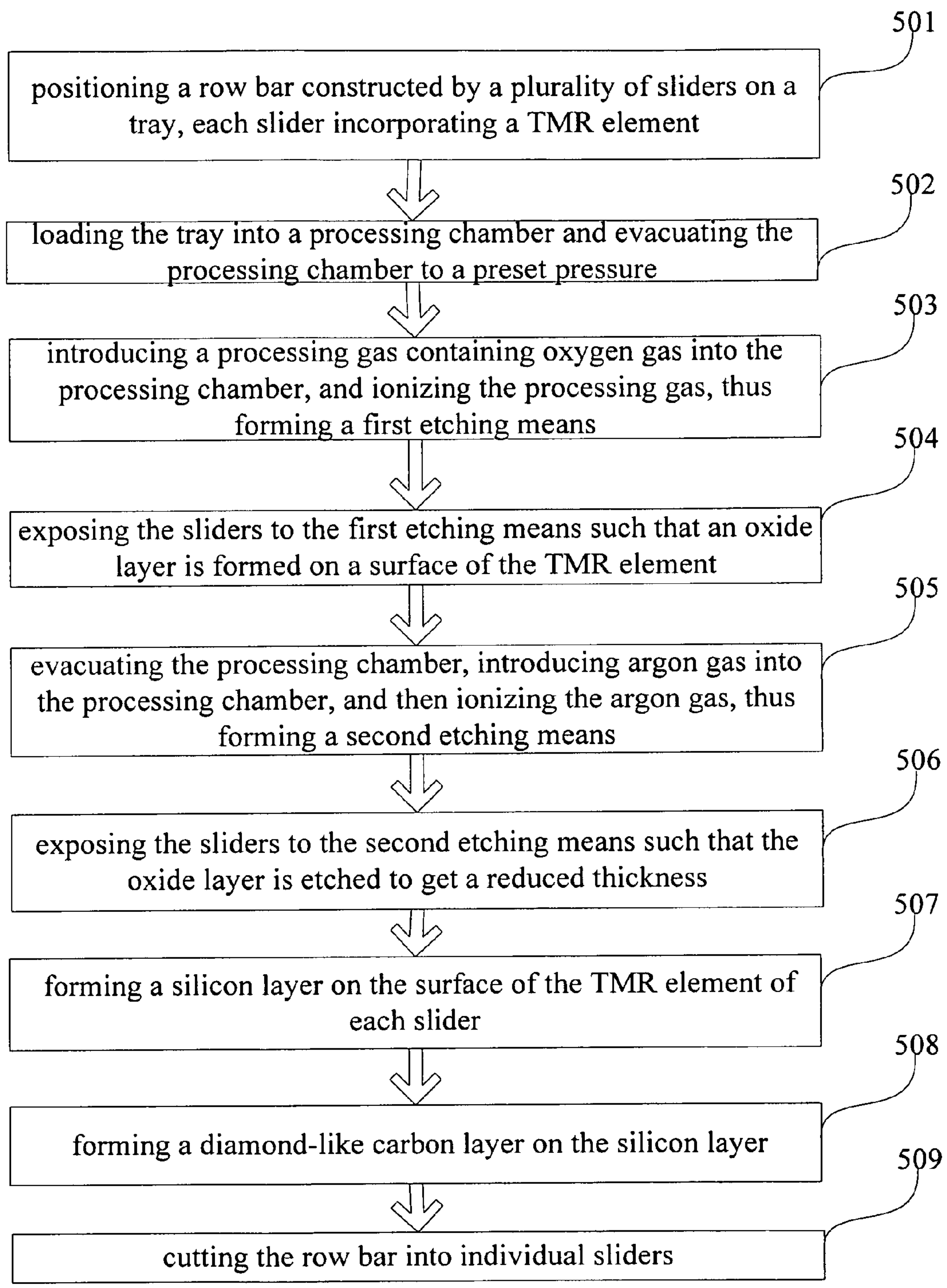
FIG. 5 shows a flowchart illustrating a method for manufacturing a slider according to an embodiment of the invention.

FIG. 5 shows a flowchart illustrating a method for manufacturing a slider according to an embodiment of the invention. The manufacturing method combines the process of preventing TMR MRR drop and the process of cutting row bars, thus obtaining sliders each of which is capable of avoiding or reducing TMR MRR drop. Firstly, a row bar constructed by a plurality of sliders is positioned on a tray, each slider incorporating a TMR element (step 501). Then, the tray is loaded into a processing chamber and then the processing chamber is evacuated to a preset pressure (step 502). Next, a processing gas containing oxygen gas is introduced into the processing chamber and ionized, thus forming a first etching means (step 503). The row bar is exposed to the first etching means to form an oxidation layer on a surface of the TMR element (step 504). The processing chamber is evacuated, argon gas is introduced into the chamber, and then the argon gas is ionized, thus forming a second etching means (step 505). Then, the row bar is exposed to the second etching means such that the oxide layer is etched to get a reduced thickness (step 506). Next, a silicon layer is formed on the surface of the TMR element of the sliders (step 507). Then, a DLC layer is formed on the silicon layer (step 508). Finally, the row bar is cut into individual sliders (step 509).

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method for preventing TMR MRR drop of a slider, comprising the steps of:
- (a) positioning a row bar constructed by a plurality of sliders on a tray, each slider incorporating a TMR element;
- (b) loading the tray into a processing chamber and evacuating the processing chamber to a predetermined pressure;
- (c) introducing a processing gas containing oxygen gas into the processing chamber, and ionizing the processing gas, thus forming a first etching means;
- (d) exposing the sliders to the first etching means such that an oxide layer is formed on a surface of the TMR element;
- (e) evacuating the processing chamber, introducing argon gas into the processing chamber, and then ionizing the argon gas, thus forming a second etching means; and
- (f) exposing the sliders to the second etching means such that the oxide layer is etched to get a reduced thickness.

2. The method according to claim 1, wherein in step (f), the oxide layer is etched to have a thickness ranging from 1 nm to 4 nm.

3. The method according to claim 2, wherein in step (f), the oxide layer is etched to have a thickness of 1.5 nm.

4. The method according to claim 1, wherein the processing gas used in the step (c) is oxygen gas.

5. The method according to claim 1, wherein the processing gas used in the step (c) is a mixture of oxygen gas and noble gas.

6. The method according to claim 1, wherein the first and second etching means are plasma or ion beam.

7. The method according to claim 6, wherein the plasma is generated by direct capacitance coupling, inductively coupling or Electron Cyclotron Resonance.

8. A method for manufacturing sliders, comprising the steps of:
- (1) positioning a row bar constructed by a plurality of sliders on a tray, each slider incorporating a TMR element;
- (2) loading the tray into a processing chamber, and evacuating the processing chamber to a predetermined pressure;
- (3) introducing a processing gas containing oxygen gas into the processing chamber, and ionizing the processing gas, thus forming a first etching means;
- (4) exposing the sliders to the first etching means such that an oxide layer is formed on a surface of the TMR element;
- (5) evacuating the processing chamber, introducing argon gas into the processing chamber, and then ionizing the argon gas, thus forming a second etching means;
- (6) exposing the sliders to the second etching means such that the oxide layer is etched to get a reduced thickness;
- (7) forming a silicon layer on the surface of the TMR element of each slider;
- (8) forming a diamond-like carbon layer on the silicon layer; and
- (9) cutting the row bar into individual sliders.

9. The method according to claim 8, wherein in step (6), the oxide layer is etched to have a thickness ranging from 1 nm to 4 nm.

10. The method according to claim 8, wherein the processing gas used in the step (3) is oxygen gas.

11. The method according to claim 8, wherein the processing gas used in the step (3) is a mixture of oxygen gas and noble gas.

12. The method according to claim 8, wherein the first and second etching means are plasma or ion beam.

13. The method according to claim 12, wherein the plasma is generated by direct capacitance coupling, inductively coupling or Electron Cyclotron Resonance.

* * * * *